(12) United States Patent
Winkler et al.

(10) Patent No.: US 9,013,014 B2
(45) Date of Patent: Apr. 21, 2015

(54) CHIP PACKAGE AND A METHOD OF MANUFACTURING THE SAME

(71) Applicant: Infineon Technologies AG, Neubiberg (DE)

(72) Inventors: Bernhard Winkler, Regensburg (DE); Horst Theuss, Wenzenbach (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/872,214

(22) Filed: Apr. 29, 2013

(65) Prior Publication Data

US 2014/0319627 A1  Oct. 30, 2014

(51) Int. Cl.
*G01P 15/08* (2006.01)
*B81B 7/00* (2006.01)

(52) U.S. Cl.
CPC ................................ *B81B 7/0061* (2013.01)

(58) Field of Classification Search
CPC ... H01L 23/3185; G01L 9/0042; G01L 13/00; G01L 15/00; G01L 19/141
USPC ..................... 257/417, 415, 690, 724
See application file for complete search history.

(56) References Cited

U.S. PATENT DOCUMENTS

| | | | |
|---|---|---|---|
| 2001/0002119 A1* | 5/2001 | Winterer et al. | 338/42 |
| 2008/0157236 A1* | 7/2008 | Chen et al. | 257/415 |
| 2009/0027352 A1* | 1/2009 | Abele | 345/173 |
| 2010/0171153 A1* | 7/2010 | Yang | 257/254 |

OTHER PUBLICATIONS

Ton Van Weelden, The Encapsulation of MEMS / Sensors and the Realization of Molded Vias on Package-On-Package Applications and Wafer Level Packages With Film Assisted Molding, 15 pages, http://www.boschman.nl/index.php/molding-principles/film-assisted-molding.html, 2013.

* cited by examiner

*Primary Examiner* — Tu-Tu Ho

(57) ABSTRACT

In various embodiments, a chip package is provided. The chip package may include at least one chip having a plurality of pressure sensor regions and encapsulation material encapsulating the chip.

9 Claims, 18 Drawing Sheets

PRIOR ART

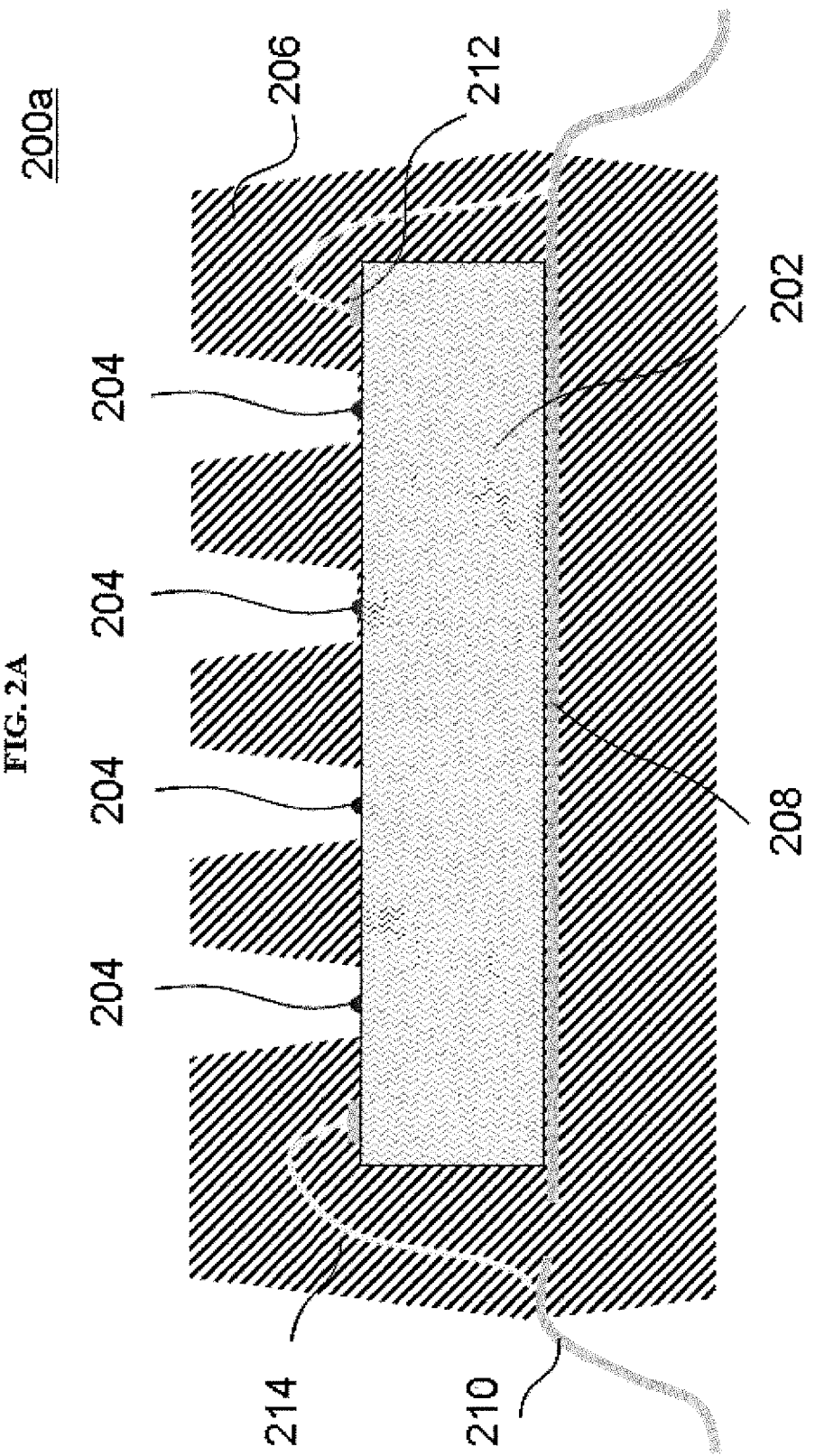

Providing at least one chip including a plurality of pressure sensor regions

302

Encapsulating the chip using encapsulation material

Providing a plurality of chips, each chip including at least one pressure sensor, wherein at least three pressure sensors are provided

802

Encapsulating the chip using encapsulation material

804

CHIP PACKAGE AND A METHOD OF MANUFACTURING THE SAME

TECHNICAL FIELD

Various embodiments relate generally to chip packages and methods of manufacturing the same.

BACKGROUND

Certain applications require the use of multiple pressure sensors. FIG. 1A is a schematic 100a showing the cross sectional side view of a conventional pressure sensor chip package. A chip 102 is mounted on a chip carrier 104. Wire bonds 106 electrically connect the chip to external contacts 108. The chip 102 is encapsulated with an encapsulation material 110. An opening 112 in the encapsulation material 110 exposes the chip 102 to the environment and allows sensing of pressure. FIG. 1B is a schematic 100b showing the cross sectional side view of a conventional pressure sensor component having a plurality of pressure sensor chip packages 142 as shown in FIG. 1A mounted on a printed circuit board (PCB) 144. FIG. 1C is a schematic 100c showing the top planar view of the conventional pressure sensor component illustrated in FIG. 1B. Conductor lines (not shown) connect the external contacts 108 of the pressure sensor chips 142 to electrical contacts 146. Other devices such as processors may also be mounted on the printed circuit board 144.

The plurality of sensor chip packages 142 are individually attached to the printed circuit board 144. A plurality of independent pressure inlets may lead to the housing of the pressure sensor component. One input or inlet may be coupled to the opening 112 of one of the plurality of chips 102. A pressure interface such as an adapter or an intermediate piece may be sealed onto the inlets of the housing to provide pressure coupling.

Multiple sensor chip packages may be required. Many individual processes may also be required to fabricate the individual sensor chip packages. The use of multiple sensor chip packages may lead to increased costs. Also, more area may be required for the multiple sensor chip packages.

SUMMARY

In various embodiments, a chip package is provided. The chip package may include at least one chip having a plurality of pressure sensor regions and encapsulation material encapsulating the chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A shows a cross sectional side view of a chip package according to various embodiments.

FIG. 3 shows a method to manufacture a chip package according to various embodiments;

FIG. 6A to FIG. 6D, shows a method to manufacture a chip package according to various embodiments; wherein FIG. 6A shows a cross sectional side view of at least one chip having a plurality of pressure sensor regions according to various embodiments; wherein FIG. 6B shows a top planar view of the at least one chip having a plurality of pressure sensor regions (as shown in FIG. 6A) according to various embodiments; wherein FIG. 6C shows a cross sectional side view of a chip package including the at least one chip (as shown in FIG. 6A) and encapsulation material encapsulating the chip according to various embodiments; and wherein FIG. 6D shows a top planar view of the chip package (as shown in FIG. 6C) according to various embodiments;

FIG. 8 shows a method to manufacture a chip package according to various embodiments; and FIG. 9, which includes FIGS. 9A to 9E, shows a schematic of manufacturing a chip package according to various embodiments; wherein FIG. 9A shows a portion of a processed wafer according to various embodiments; wherein FIG. 9B shows a cross sectional side view of a singulated block (or assemblage) including a plurality of chips according to various embodiments; wherein FIG. 9C shows a top planar view of the singulated block (or assemblage) in FIG. 9B according to various embodiments; wherein FIG. 9D shows a cross sectional side view of a chip package according to various embodiments; and wherein FIG. 9E shows a top planar view of the chip package shown in FIG. 9D according to various embodiments.

DESCRIPTION

Figure 1A:
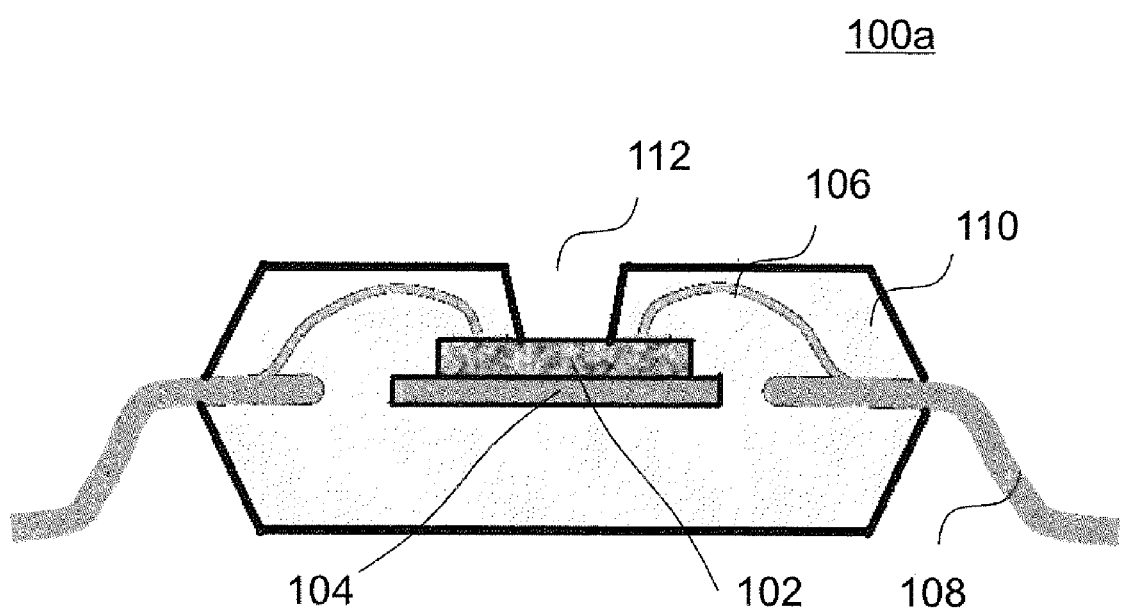
FIG. 1A shows the cross sectional side view of a pressure sensor chip package.
Figure 1B:
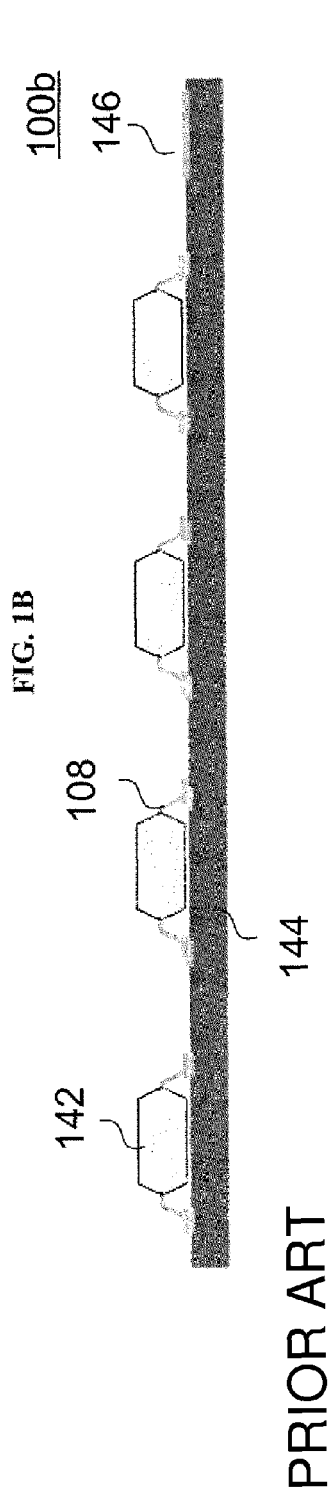
FIG. 1B shows the cross sectional side view of a conventional pressure sensor component having a plurality of pressure sensor chip packages shown in FIG. 1A mounted on a printed circuit board.
Figure 1C:
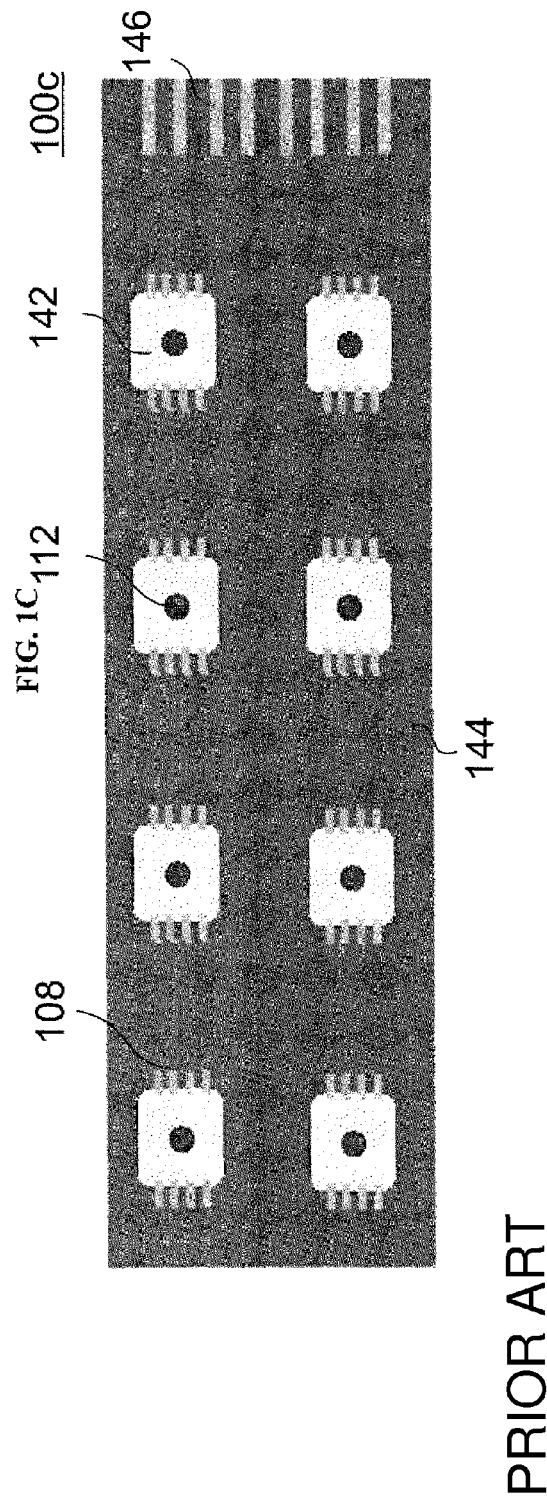
FIG. 1C shows the top planar view of the conventional pressure sensor component illustrated in FIG. 1B.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a multiple sensor chip packages. Furthermore, various individual processes are provided to fabricate individual sensor chip packages. Various embodiments provide multiple sensor chip packages of reduced costs. Also, the required area required for the multiple sensor chip packages is reduced in various embodiments.

Various aspects of this disclosure may provide an improved chip package and a method of manufacturing the same that is able to address at least partially some of the abovementioned challenges.

FIG. 2A shows a schematic 200a having a cross sectional side view of a chip package according to various embodiments. The chip package may include at least one chip 202 having a plurality of pressure sensor regions 204 and encapsulation material 206 encapsulating the chip 202.

In various embodiments, one or more chips 202 may be encapsulated by the encapsulation material 206. At least one chip 202 of the one or more chips 202 may have a plurality of pressure sensor regions 204. The encapsulation material 206 may include (press) mold material and/or lamination material (such as e.g. polymer material together with glass fibers), for example.

Various embodiments may provide a single chip package to be mounted on a circuit board. Various embodiments may provide savings in area occupied by the chips. Various embodiments may provide for different pressures to be measured using a single chip package. Various embodiments may provide for different pressures to be measured simultaneously using a single chip package.

In various embodiments, the chip package may include a single chip 202. In various embodiments, the chip package may provide a System-On-Chip (SoC) solution.

In various embodiments, the pressure sensor region 204 may include a membrane structure. The membrane structure may include at least one membrane.

The at least one chip 202 may be configured to detect or measure pressure of a fluid using capacitance. The at least one chip 202 may include a membrane structure. The membrane structure may include at least one membrane. having an electrode. The electrode may form a capacitor with a counter electrode. The at least one membrane may be exposed to the fluid. The fluid may cause the at least one membrane to deflect. The distance between the electrode and the counter electrode may change and cause a capacitance change in the capacitor.

In various embodiments, the at least one chip 202 may be configured to detect or measure pressure of a fluid using piezoresistance. The at least one chip 202 may include a membrane structure. The membrane structure may include at least one membrane having a strain gauge. The at least one membrane may be exposed to the fluid. The fluid may cause the at least one membrane to deflect. The strain gauge may have a resistance that changes due to varying force applied to the strain gauge. The strain gauge may for instance, cause current flowing through the strain gauge to vary as the strain gauge is stretched or compressed as the membrane deflects due to varying pressure. In various embodiments, the chip 202 may be configured to detect or measure pressure of a fluid using pizeoelectricity or any other suitable effects.

In various embodiments, a surface region of at least two pressure sensor regions of the plurality of sensor regions 204 may be free from encapsulation material. In various embodiments, a surface region of each of at least two pressure sensor regions of the plurality of sensor regions 204 may be free from encapsulation material. In various embodiments, two pressure sensor regions for the plurality of sensor regions 204 may be free from encapsulation material 206.

In various embodiments, the encapsulation material 206 may include a molding material.

Figure 2B:
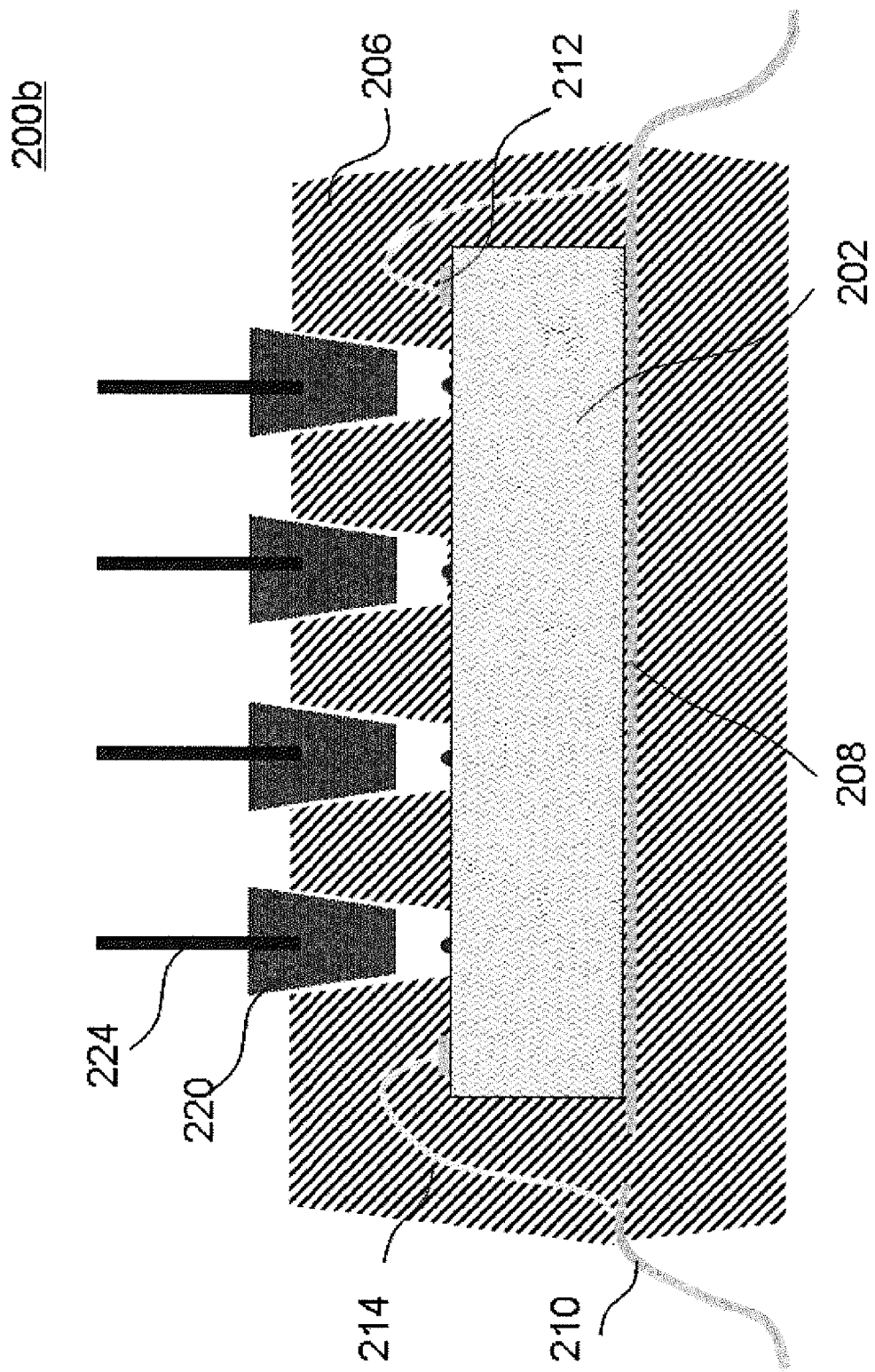
FIG. 2B shows a cross sectional side view of the chip package as illustrated in FIG. 2A with a plurality of pressure measuring structures and fluid supply structures according to various embodiments.

FIG. 2B shows schematic 200b of a cross sectional side view of the chip package as illustrated in FIG. 2A with a plurality of pressure measuring structures 220 and fluid supply structures 224 according to various embodiments. In various embodiments, at least one pressure sensor region may include a pressure measuring inlet structure 220 configured to receive a fluid supply structure 224. The pressure measuring inlet structure 220 may include an opening to the chip 202. The fluid supply structure 224 may include a tube, e.g. a flexible tube. The pressure measuring inlet structure 220 may include a holding structure configured to hold the fluid supply structure. The pressure measuring inlet structure 220 may include a sealing structure to seal a coupling with the fluid supply structure 224.

In various embodiments, at least one pressure sensor region may be coupled to an enclosed cavity. In various embodiments, at least one pressure sensor region is configured to sense a pressure of a fluid. In various embodiments, the at least one pressure sensor region is configured to sense the pressure of the fluid include a pressure inlet structure configured to receive a fluid supply structure. In various embodiments, the at least one pressure sensor region coupled to an enclosed cavity and the at least one pressure sensor region configured to sense a pressure of a fluid may form a differential sensor.

In various embodiments, at least one pressure sensor region may be coupled to a reference volume (a fixed volume of fluid or vaccum that acts as a reference), thereby providing a differential pressure sensor region. The at least one pressure sensor region may include a membrane structure. The membrane structure may include at least one membrane. A first side of the at least one membrane may be coupled to the reference volume. A second side of the at least one membrane opposite the first side may be configured to sense the pressure of the fluid.

In various embodiments the chip 202 may be configured to detect or measure up to about 15 bars of pressure, e.g. from about 2 bars to about 13 bars, e.g. from about 5 bars to about 10 bars.

In various embodiments, the chip package may include a chip carrier 208 carrying the chip 202. The chip 202 may be coupled with the chip carrier 208 using surface mount technology (SMT). The chip 202 may be coupled with the chip carrier 208 using through hole technology (THT). The chip 202 may be coupled with the chip carrier 208 using flip chip bonding. The chip carrier 208 may include a leadframe. The leadframe may be a pre-structured leadframe or a post-structured leadframe. The chip carrier 208 may include a substrate. The chip carrier 208 may include or be made of a metallic chip carrier 208. The chip carrier 208 may be patterned by means of etching and/or stamping.

In various embodiments, the chip package may include at least one electrical contact 210 being partially free from encapsulation material 206. The at least one electrical contact 210 may include electrically conductive legs such as metal legs (which may also be referred to as electrically conductive leads such as metal leads). The at least one electrical contact 210 may include electrically conductive pads such as metal pads. The at least one electrical contact 210 may include electrically conductive pins such as metal pins. In various embodiments, the at least one electrical contact 210 may extend from the chip 202.

In various embodiments, the chip may include at least one chip contact 212. The chip contact 212 may be electrically coupled with the at least one electrical contact 210. The at least one chip contact 212 may be electrically coupled with the at least one electrical contact 210 via a wire 214 (e.g. wire bond). In other words, the at least one chip contact 212 may be electrically coupled with the at least one electrical contact 210 via wire bonding. In various embodiments, the at least one chip contact 212 may be electrically coupled with the at least one electrical contact 210 via the chip carrier 208. In various embodiments, the at least one chip contact 212 may be electrically coupled with the at least one electrical contact 210 via a redistribution layer.

In various embodiments, the chip package may include at least one electronic circuit. The electronic circuit may be configured to process sensor signals provided by at least one pressure sensor region of the plurality of pressure sensor regions 204, e.g. to condition the sensor signals, e.g. including filtering, digitizing, etc. In various embodiments, the electronic circuit may also be configured to control the chip 202, e.g. to activate/deactivate the pressure sensor regions 204.

In various embodiments, the chip package may include a redistribution layer coupled to the at least one chip contact. In various embodiments, the resistribution layer may be disposed over the encapsulation material 206 and may provide one or more redistribution conductor tracks.

In various embodiments, the at least one chip 202 may include a plurality of chips. In various embodiments, the plurality of chips may be monolithically integrated on the same substrate (e.g. the same wafer).

In various, embodiments, the chip package may further include one or more chips without pressure sensor regions, such as application specific integrated circuit (ASIC) chips, processor chips etc.

FIG. 3 is a schematic 300 showing a method to manufacture a chip package according to various embodiments. The method may include, in 302, providing at least one chip including a plurality of pressure sensor regions. The method may further include, in 304, encapsulating the chip using encapsulation material.

In various embodiments, a surface region of at least two pressure sensor regions of the plurality of pressure sensor regions may be free from encapsulation material. In various embodiments, at least two pressure sensor regions of the plurality of pressure sensor regions may be free from encapsulation material.

In various embodiments, at least one pressure sensor regions may include a pressure measuring inlet structure configured to receive a fluid supply structure. The fluid supply structure may include a tube, e.g. a flexible tube. The pressure measuring inlet structure may include a holding structure configured to hold the fluid supply structure. The pressure measuring inlet structure may include a sealing structure configured to seal a coupling with the fluid supply structure.

The method may further include providing a chip carrier to carry the chip. In various embodiments, the method may further provide bonding or attaching the chip to the chip carrier. Bonding or attaching the chip to the chip carrier may include surface mounting technology (SMT). Bonding or attaching the chip to the chip carrier may include through hole technology (THT). Bonding or attaching the chip to the chip carrier may include flip chip bonding. The chip carrier may include a leadframe. The chip carrier may include a substrate.

In various embodiments, the method may further include forming at least one electrical contact being partially free from encapsulation material. Forming at least one electrical contact being partially free from encapsulation material may include covering partially the at least one electrical contact prior to depositing the encapsulating material. Forming the at least one electrical contact may include covering partially the at least one electrical contact prior to depositing the encapsulating material with a masking material such as a dielectric material. Forming the at least one electrical contact may include removing the masking material may include removing the masking material after depositing the encapsulation material. Forming the at least one electrical contact may include a photolithography process. The masking material may be a photoresist.

In various embodiments, the at least one chip includes at least one chip contact. The at least one chip contact may be electrically coupled with at least one electrical contact. The at least one chip contact may electrically coupled with the at least one electrical contact via a wire. The at least one chip contact may electrically coupled with the at least one electrical contact via the chip carrier. The at least one chip contact may electrically coupled with the at least one electrical contact via a redistribution layer.

In various embodiments, the method may further include forming at least one electronic circuit. In various embodiments, the at least one electronic circuit may be configured to process sensor signals provided by at least one pressure sensor region of the plurality of pressure sensor regions.

In various embodiments, the method may further include forming a redistribution layer coupled to the at least one chip contact. The redistribution layer may be disposed over the encapsulation material. The redistribution layer may be disposed at least partially over the at least one chip. In various embodiments, the method may include covering the redistribution layer at least partially with a dielectric layer. In various embodiments, the method may include embedding the redistribution layer at least partially in a dielectric layer.

In various embodiments, the method may provide depositing dielectric material over the encapsulation material. The method may further provide forming a via on the deposited dielectric material and if necessary, on the encapsulation material, to expose the at least one chip contact. The method may also provide depositing a conductive material or a metal such that a redistribution layer is coupled to the at least one chip contact. The method may further provide depositing further dielectric material to form a dielectric layer at least embedding the redistribution layer.

In various embodiments, the method may provide depositing a conductive material or a metal over the encapsulation material. The method may further provide forming a via on the encapsulation material. The method may additionally provide depositing dielectric material to form a dielectric layer at least partially covering the redistribution layer.

In various embodiments, the at least one chip includes a plurality of chips. The plurality of chips may be monolithically integrated on the same substrate (e.g. the same wafer).

Figure 4A:
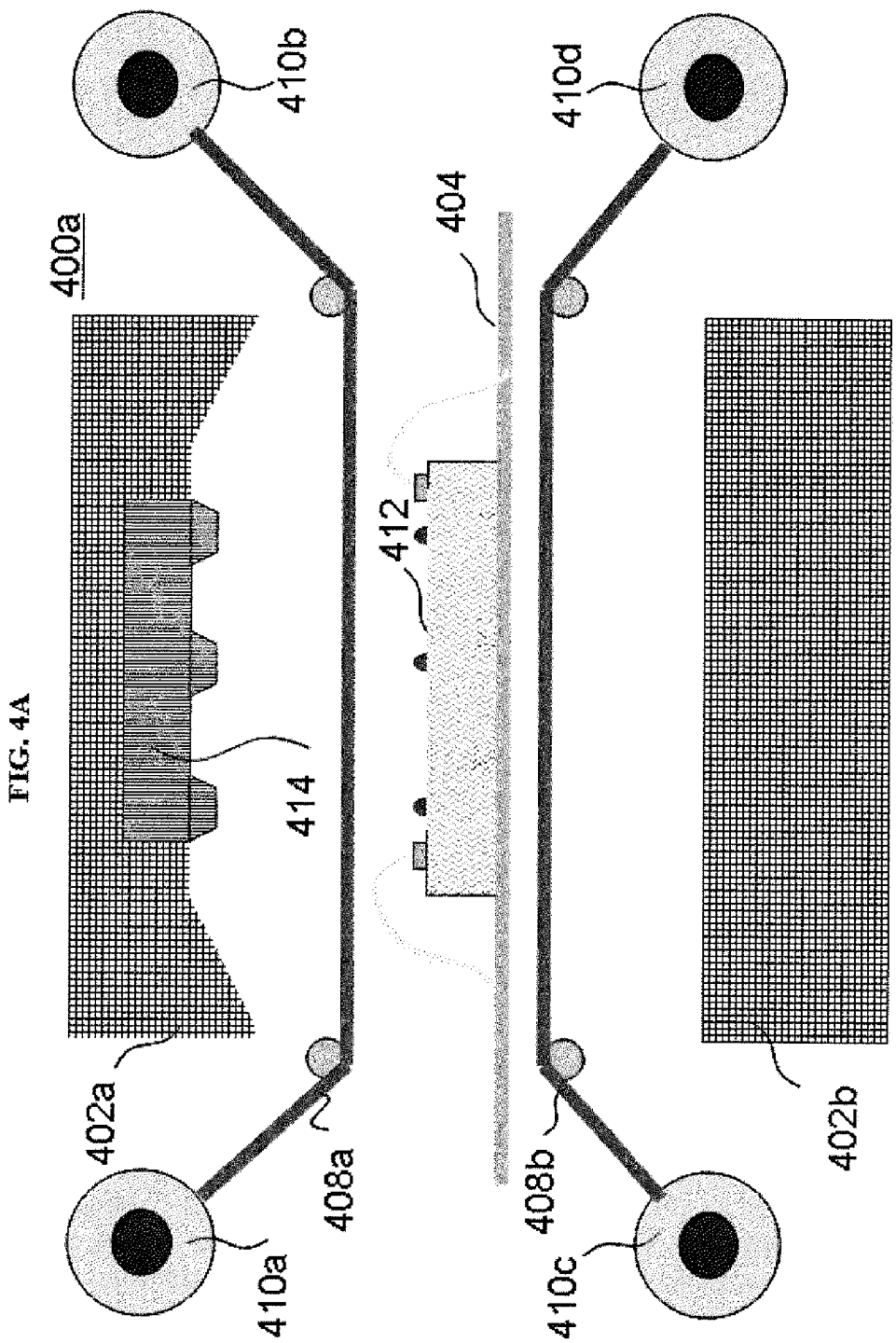
FIG. 4A shows bringing at least one mold to form a mold cavity with the chip carrier in single exposed chip (die) molding according to various embodiments.
Figure 4B:
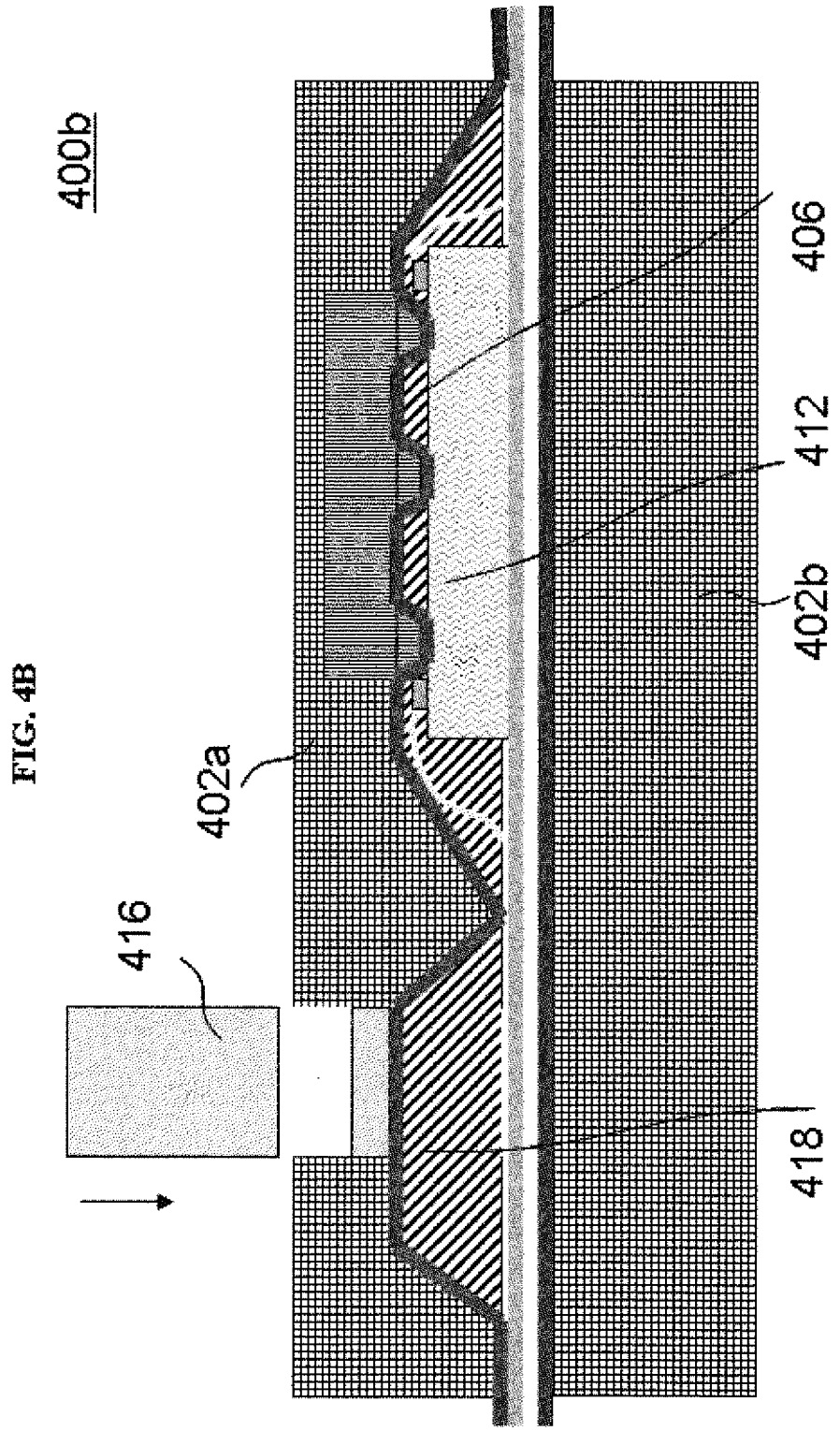
FIG. 4B shows forming the mold according to various embodiments.
Figure 4C:
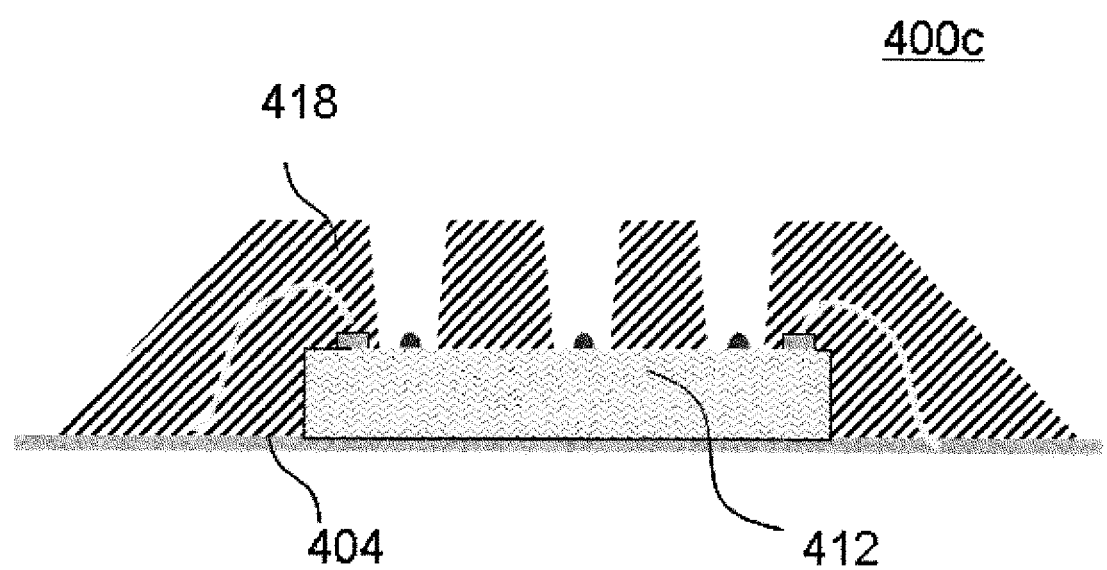
FIG. 4C shows an encapsulated chip according to various embodiments formed with the at least one mold in FIG. 4A.

In various embodiments, encapsulating the chip using encapsulation material may include a film assisted molding process. FIG. 4A shows a schematic 400*a* of bringing at least one mold to form a mold cavity with the chip carrier in single exposed chip (die) molding according to various embodiments. FIG. 4B shows a schematic 400*b* of forming the mold according to various embodiments. FIG. 4C shows a schematic 400c of an encapsulated chip according to various embodiments formed with the at least mold in FIG. 4A. In various embodiments, a film assisted molding process includes bringing at least one mold 402a, 402b together with the chip carrier 404 to form at least one mold cavity 406. The mold may be covered by a foil or a film 408a, 408b. The foil or film 408a, 408b may be applied using rollers 410a, 410b, 410c, 410d. The foil or film 408 may be adhered to the mold 402a, 402b using a vacuum process. The chip 412 may be at least partially covered by press mass or insert 414. The chip 412 may be at least partially covered by press mass or insert 414 such that a surface region of at least two pressure sensor regions of the plurality of pressure sensor regions is free from encapsulation material 418. In various embodiments, the press mass or insert 414 may make contact with at least two pressure sensors of the plurality of pressure sensor regions such that the at least two pressure sensor regions is free from encapsulation material 418. The encapsulation material 418 may include a mold material.

Encapsulating the chip may further include loading encapsulation material 418 into the at least one mold cavity 406. The encapsulation material 418 may liquefied by heat and pressure. The liquefied encapsulation material 418 may then flow into the at least one mold cavity 406. The liquefied mold material 418 may be held in the at least one mold cavity 406 under heat and pressure until substantially all mold material 418 is solidified to form the encapsulated chip. The temperature at which the mold material is liquefied may range from about 120° C. to about 250° C., e.g. from about 150° C. to about 200° C. e.g. about 175° C. The pressure at which the mold material 418 is liquefied may range from about 30 bars to about 200 bars, e.g. from about 60 bars to about 100 bars. The temperature at which the liquefied mold material 418 is held in the at least one mold cavity 406 to be solidified may range from about 150° C. to about 200° C. The pressure at which the liquefied mold material 418 is held in the at least one mold cavity to be solidified may range from about 70 bar to about 130 bar. The pressure may be applied by a plunger 416.

The liquefied mold material may be held within the mold cavity 406 under evaluated pressure and temperature until it substantially or completely solidifies. The chip may then be encapsulated by the solidified mold material 418. The at least one mold 402a, 402b may then be removed.

Figure 5A:
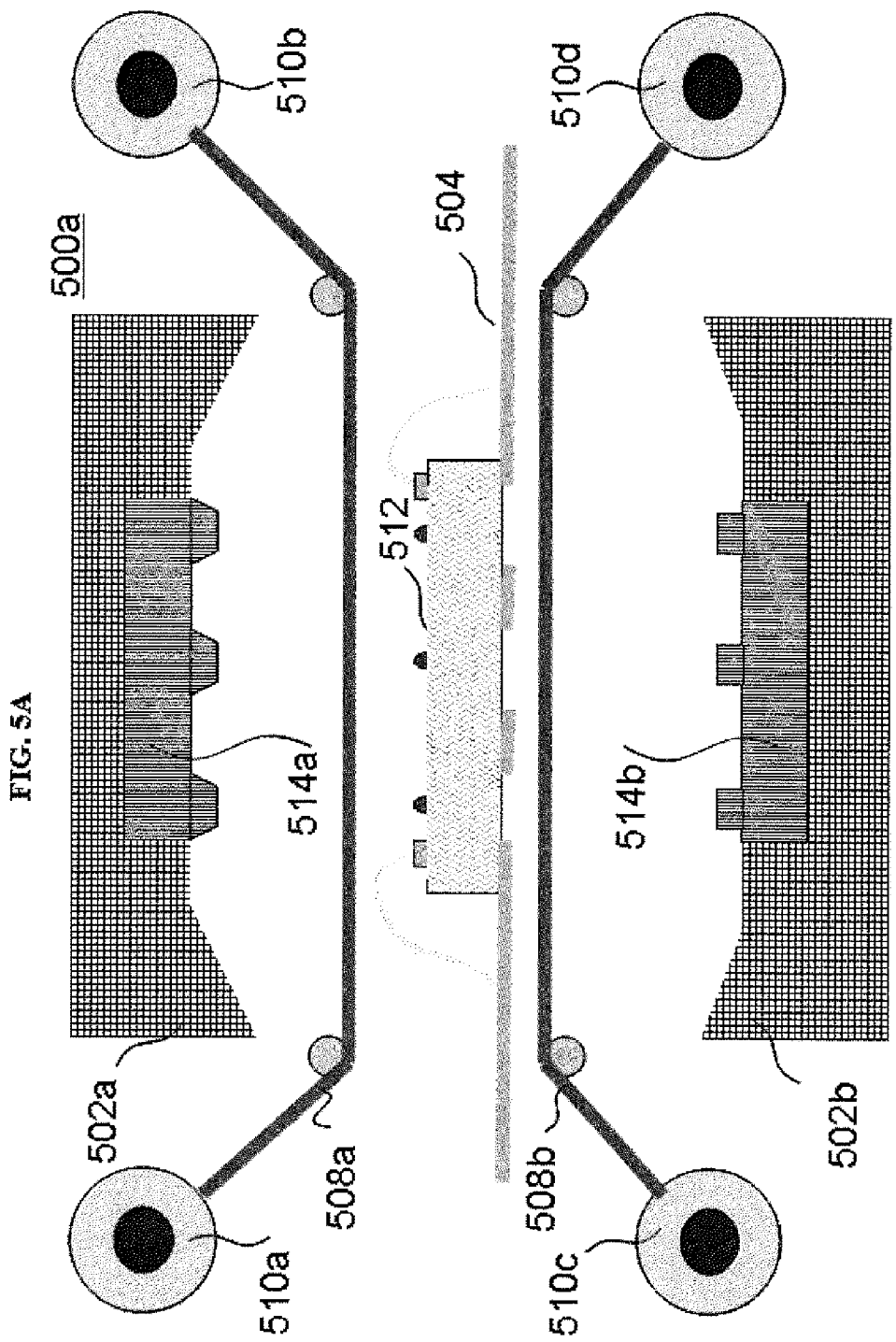
FIG. 5A shows bringing at least two molds to form a mold cavity with the chip carrier in double exposed chip (die) molding according to various embodiments.
Figure 5B:
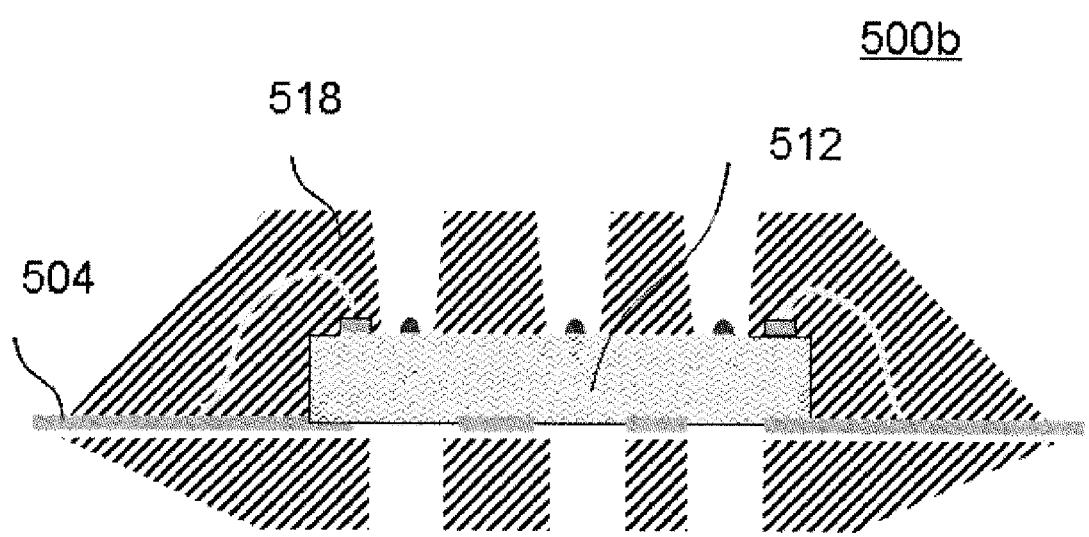
FIG. 5B shows an encapsulated chip according to various embodiments formed with the molds in FIG. 5A.

FIG. 5A shows a schematic 500a of bringing at least two molds to form a mold cavity with the chip carrier in double exposed chip (die) molding according to various embodiments. FIG. 5B shows a schematic 500b of an encapsulated chip according to various embodiments formed with the molds in FIG. 5A. In various embodiments, a film assisted molding process includes bringing at least two molds 502a, 502b together with the chip carrier 504 to form at least one mold cavity. The mold may be covered by foils or films 508a, 508b. The foils or films 508a, 508b may be applied using rollers 510a, 510b, 510c, 510d. The foils or films 508a, 508b may be adhered to the molds 502a, 502b using a vacuum process. The chip 512 may be at least partially covered by press masses or inserts 514a, 514b. The chip 512 may be at least partially covered by press masses or inserts 514a, 514b such that a surface region of at least two pressure sensors of the plurality of pressure sensor regions is free from encapsulation material. In various embodiments, press masses or inserts 514a, 514b may allow a first surface region of the at least two sensors on a first side of the chip 512 and a second surface region of the at least two sensors on a second side (opposite the first side) of the chip 512 to be free from encapsulation material.

Figure 6:
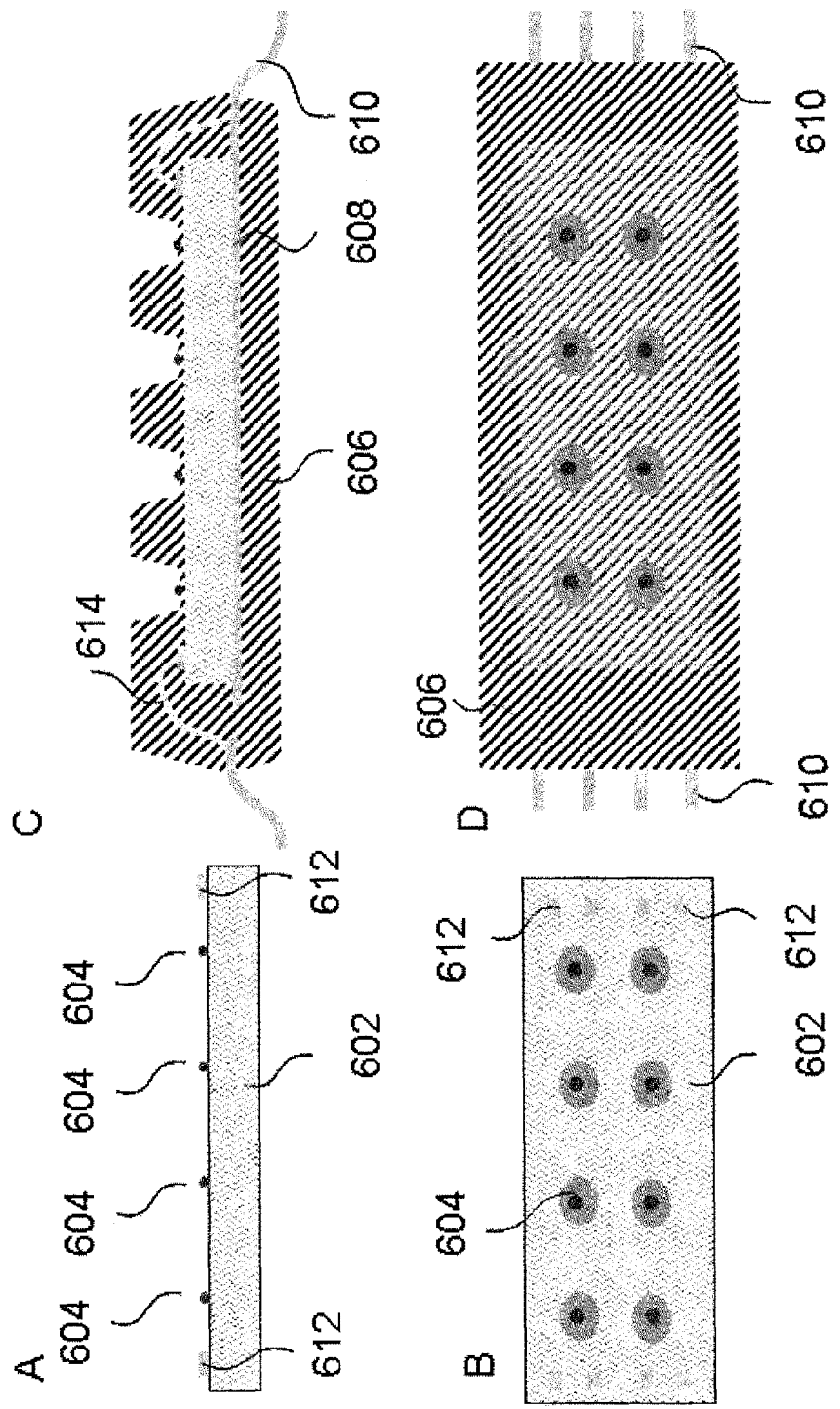
FIG. 6, which includes

FIG. 6 shows a schematic 600 of manufacturing a chip package according to various embodiments. FIG. 6A is a cross sectional side view showing at least one chip 602 having a plurality of pressure sensor regions 604 according to various embodiments. FIG. 6B is a top planar view showing the at least one chip 602 having a plurality of pressure sensor regions 604 (as shown in FIG. 6A) according to various embodiments. In various embodiments, the at least one chip may include at least one chip contact 612. FIG. 6C is a cross sectional side view showing a chip package including the at least one chip 602 (as shown in FIG. 6A) and encapsulation material 606 encapsulating the chip 602 according to various embodiments. FIG. 6D is a top planar view showing the chip package (as shown in FIG. 6C) according to various embodiments.

In various embodiments, the method may provide proving at least one chip 602 having a plurality of pressure sensor regions 604. The method may further provide encapsulating the chip 602 using encapsulation material 606. In various embodiments, encapsulating the chip 602 may include encapsulating the chip 602 such that a surface region of at least two pressure sensor regions of the plurality of pressure sensor regions 604 is free from encapsulation material 606. The method may also include proving a chip carrier 608 to carry the chip 602. The chip carrier 608 may include a leadframe.

The method may also include forming at least one electrical contact 610. The at least one electrical contact 610 may be formed on the chip carrier 602. Forming the at least one electrical contact 610 may include forming the at least one electrical contact 610 before encapsulating the chip 602. Forming the at least one electrical contact 610 may include attaching the electrical contact 610 to the chip carrier 602. Forming the at least one electrical contact 610 may include using solder or adhesive to attach the at least one electrical contact 610 to the chip carrier 602. The method may further include electrically coupling the at least one electrical contact 610 with at least one chip contact 612. In various embodiments, electrically coupling the at least one electrical contact 610 with at the least one chip contact 612 may include electrical coupling using a wire 610 or through the chip carrier 602. Electrically coupling the at least one electrical contact 610 with at least one chip contact 612 may include electrically coupling before encapsulating the chip 602.

The at least one electrical contact may be formed at least partially embedded in the encapsulation material 606. Forming at least one electrical contact 610 may include electrically coupling the at least one electrical contact 610 with at least one chip contact 612 before encapsulating such that the at least one electrical contact 610 is fixed in position by the encapsulation material 606.

Forming the at least one electrical contact 610 may include depositing a masking layer on a chip carrier 602 to define at least one region for forming the at least one electrical contact 610. The at least one electrical contact 610 may include a conductive pad. Forming the at least one electrical contact 610 may further include depositing a conductive material such as a metal using a process such as physical vapour deposition. Forming the at least one electrical contact 610 may further include removing the masking material after deposition.

Forming the at least one electrical contact 610 may include depositing a masking layer on the encapsulation material 606. Forming the at least one electrical contact 610 may further include depositing a conductive material such as a metal using a process such as physical vapour deposition. Forming the at least one electrical contact 610 may further include removing the masking material after deposition. The method may further provide etching the encapsulation material 606 and depositing a conductive material to electrically couple the at least one electrical contact 610 with the at least one chip contact 612.

Figure 7A:
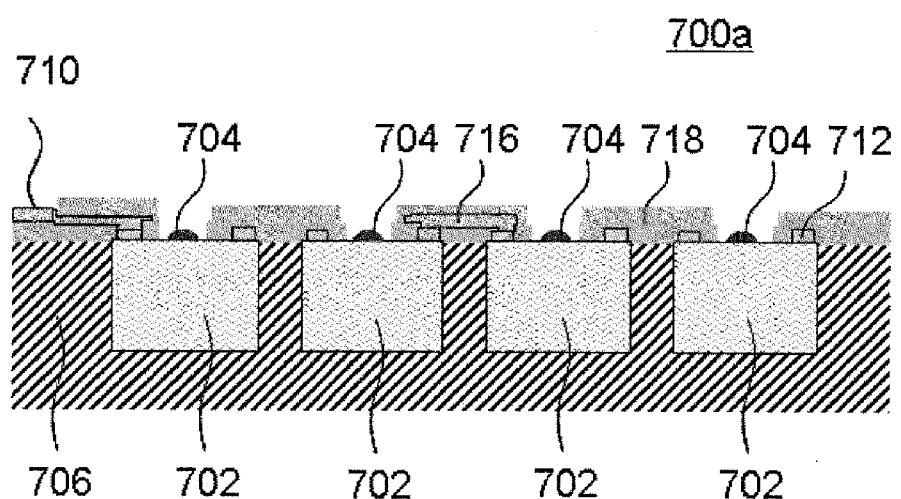
FIG. 7A shows a cross sectional side view of a chip package according to various embodiments.
Figure 7B:
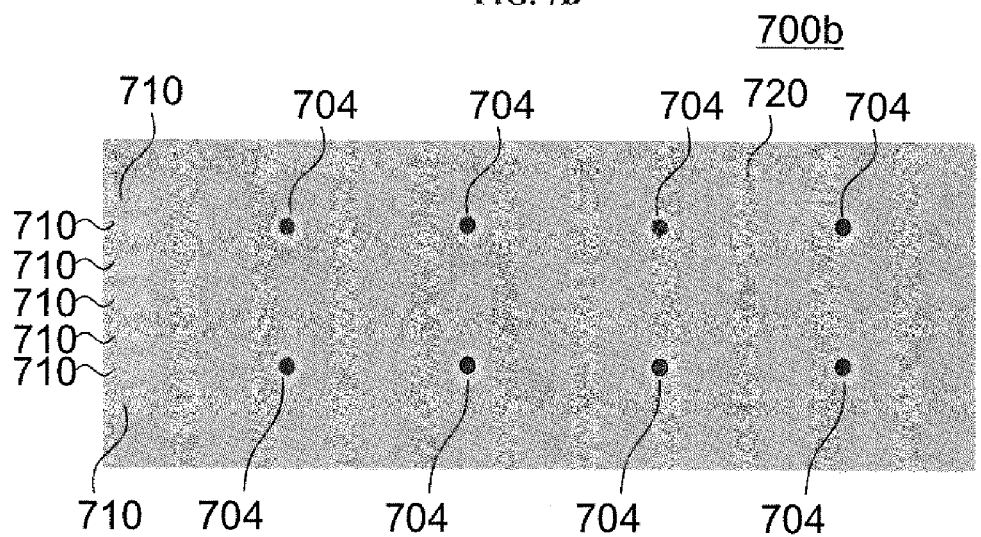
FIG. 7B shows a top planar view of the chip package (as shown in FIG. 7A) according to various embodiments.

FIG. 7A shows a schematic 700a having a cross sectional side view of a chip package according to various embodiments. FIG. 7B shows a schematic 700b having a top planar view of the chip package (as shown in FIG. 7A) according to various embodiments. In various embodiments, the chip package may include a plurality of chips 702. Each chip 702 may include at least one pressure sensor region 704. At least three pressure sensor regions 704 may be provided. The chip package may further include encapsulation material 706 encapsulating the chip 702.

In various embodiments, the chip package may include two or more chips 702. Each chip 702 may include at least one pressure sensor region 704. The chip package may have at least three pressure sensor regions 704 in total. The at least three pressure sensor regions 704 may be distributed amongst the two or more chips 702. The two or more chips 702 may be encapsulated by an encapsulation material 706.

In various embodiments, the chip package may include a plurality of chips 702. In various embodiments, the chip package may use a System-in-Package (SIP) solution. Various embodiments may provide for one packaging process for a plurality of chips 702. Various embodiments may provide savings in manufacturing costs. Various embodiments may provide for one single chip design and wafer layout.

In various embodiments, the chip package may include at least one chip 702 having a plurality of pressure sensor regions 704 and encapsulation material 706 encapsulating the (at least one) chip 702.

The plurality of chips 702 may be configured to detect or measure pressure of a fluid using capacitance. The plurality of chips 702 may each include a membrane structure. The membrane structure may include at least one membrane having an electrode. The electrode may form a capacitor with a counter electrode. The at least one membrane may be exposed to the fluid. The fluid may cause the at least one membrane to deflect. The distance between the electrode and the counter electrode may change and cause a capacitance change in the capacitor.

In various embodiments, the plurality of chips 702 may be configured to detect or measure pressure of a fluid using piezoresistance. The plurality of chips 702 may each include a membrane structure. The membrane structure may include at least one membrane having a strain gauge. The at least one membrane may be exposed to the fluid. The fluid may cause the at least one membrane to deflect. The strain gauge may have a resistance that changes due to varying force applied to the strain gauge. The strain gauge may for instance, cause current flowing through the strain gauge to vary as the strain gauge is stretched or compressed as the membrane deflects due to varying pressure. In various embodiments, the plurality of chips 702 may be configured to detect or measure pressure of a fluid using pizeoelectricity or any other suitable effects.

In various embodiments, a surface region of at least three pressure sensor regions of the plurality of pressure sensor regions 704 may be free from encapsulation material 706. In various embodiments, the plurality of pressure sensor regions 704 may include the three pressure sensor regions. In various embodiments, a surface region of each of the at least three pressure sensor regions may be free from encapsulation material 706. In various embodiments, at least three pressure sensor regions of the plurality of pressure sensor regions 704 may be free from encapsulation material 706.

In various embodiments, at least one pressure sensor region may be coupled to an enclosed cavity. In various embodiments, the at least one pressure sensor region is configured to sense the pressure of a fluid. In various embodiments, the at least one pressure sensor region is configured to sense the pressure of the fluid include a pressure inlet structure configured to receive a fluid supply structure. In various embodiments, the at least one pressure sensor region coupled to an enclosed cavity and the at least one pressure sensor region configured to sense a pressure of a fluid may form a differential sensor.

In various embodiments, at least one pressure sensor region may be coupled to a reference volume (a fixed volume of fluid or vaccum that acts as a reference). The at least one pressure sensor region may include a membrane structure. The membrane structure may include at least one membrane. A first side of the at least one membrane may be coupled to the reference volume. A second side of the at least one membrane opposite the first side may be configured to sense the pressure of the fluid.

In various embodiments the chip 702 may be configured to detect or measure up to about 15 bars of pressure, e.g. from about 2 to about 13 bars, e.g. from about 5 bars to about 10 bars.

In various embodiments, the chip package may include a chip carrier 708 carrying the chip or plurality of chips 702. The chip or plurality of chips 702 may be coupled with the chip carrier 708 using surface mount technology (SMT). The chip or plurality of chips 702 may be coupled with the chip carrier 708 using through hole technology (THT). The chip or plurality of chips 702 may be coupled with the chip carrier 708 using flip chip bonding. The chip carrier 708 may include a leadframe. The leadframe may be a pre-structured leadframe or a post-structured leadframe. The chip carrier 708 may include a substrate.

In various embodiments, the chip package may include at least one electrical contact 710 being partially free from encapsulation material 706. The at least one electrical contact 710 may be electrically conductive pads such as metal pads. The at least one electrical contact 710 may be electrically conductive legs such as metal legs. The at least one electrical contact 710 may be electrically conductive pins such as metal pins. In various embodiments, the at least one electrical contact 710 may extend from the chip 702.

In various embodiments, the at least one chip may include at least one chip contact 712. In various embodiments, at least one chip of the plurality of chips may include at least one chip contact 712. The at least one chip contact 712 may be electrically coupled with the at least one electrical contact 710. In various embodiments, the at least one chip contact 712 may be electrically coupled with the at least one electrical contact 710 via a redistribution layer 716. In various embodiments, the at least one chip contact 712 may be electrically coupled with the at least one electrical contact 710 via a wire 714 (e.g. wire bond). In other words, the at least one chip contact 712 may be electrically coupled with the at least one electrical contact 210 via wire bonding. In various embodiments, the at least one chip contact 712 may be electrically coupled with the at least one electrical contact 710 via the chip carrier 708. In various embodiments, the at least one chip contact 712 may be electrically coupled with the at least one electrical contact 710 via a redistribution layer 716.

In various embodiments, the chip package may include at least one electronic circuit. The electronic circuit may be configured to process sensor signals provided by at least one pressure sensor region of the plurality of pressure sensor regions 704. The electronic circuit may be configured to control the chip 702.

In various embodiments, the chip package may include a redistribution layer 716 coupled to the at least one chip contact 712. In various embodiments, the redistribution layer 716 may be disposed over the encapsulation material 706. In various embodiments, the redistribution layer 716 may at least be partially covered by dielectric material 718. In various embodiments, the redistribution layer 716 may at least be partially embedded in dielectric material 718. The dielectric material 718 may include polyimide or any other suitable polymer material. In various embodiments, the redistribution layer 718 may include a conductive material. In various embodiments, the redistribution layer 718 may include a metal such as aluminium.

In various embodiments, the plurality of chips 702 may be integrated on the same substrate (e.g. wafer).

Figure 7C:
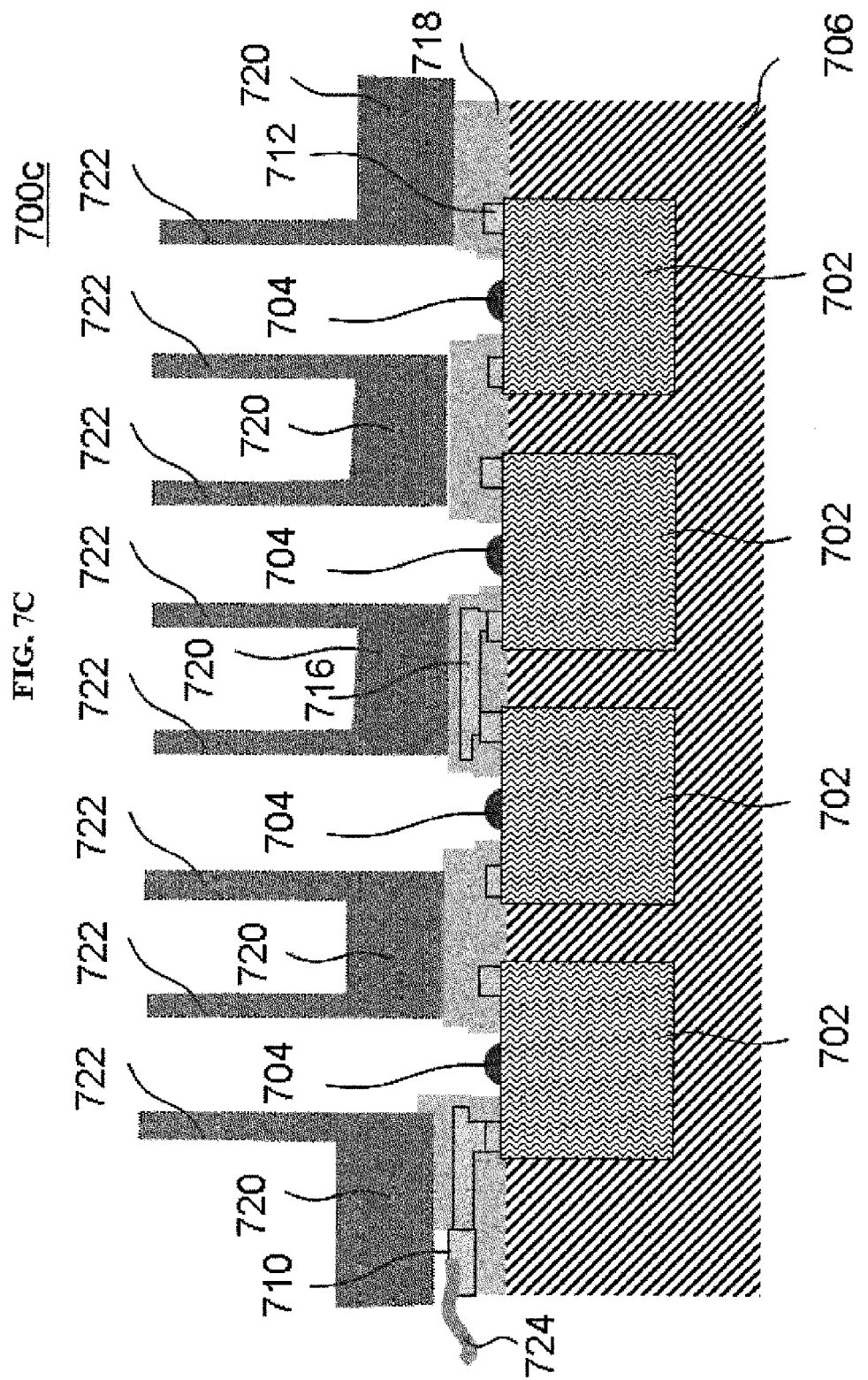
FIG. 7C shows a cross sectional side view of a chip package with pressure measuring inlets according to various embodiments.

FIG. 7C shows a schematic 700c having a cross sectional side view of a chip package with pressure measuring inlets 720 according to various embodiments. In various embodiments, at least one pressure sensor region 704 may include a pressure measuring inlet structure 720 configured to receive a fluid supply structure. In various embodiments, the pressure measuring inlet structure 720 may be configured to cooperate with a further measuring inlet structure to receive a fluid supply structure. In various embodiments, the fluid supply structure may include a tube, e.g. a flexible tube. In various embodiments, the fluid supply structure may include a pipe. In various embodiments, the pressure measuring inlet 720 may include a holding structure 722 configured to hold the fluid supply structure. In various embodiments, the pressure measuring inlet 720 may include a holding structure 722 configured to cooperate with a further holding structure from a further measuring inlet to hold the fluid supply structure. In various embodiments, the pressure measuring inlet may include a sealing structure configured to seal a coupling with the fluid supply structure. In various embodiments, the fluid inlet structure may be arranged over at least one chip of the plurality of chips 702. In various embodiments, the fluid inlet structure may be attached to the at least one chip or to the encapsulation material or to the dielectric layer or to the redistribution layer. In various embodiments, the attachment may include attachment via an adhesive or glue.

In various embodiments, the chip package may further include an electrical interconnect 724 (e.g. a cable) coupled to the at least one electrical contact 710.

FIG. 8 is a schematic 800 showing a method to manufacture a chip package according to various embodiments. The method may include, in 802, providing a plurality of chips, each chip including one pressure sensor region. At least three sensor regions may be provided. The method may further include, in 804, encapsulating the chip using encapsulation material.

In various embodiments, a surface region of at least three pressure sensor regions of the plurality of pressure sensor regions may be free from encapsulation material. In various embodiments, the plurality of pressure sensor regions may include the at least three pressures sensor regions. In various embodiments, a surface region of each of the at least three pressure sensor regions may be free from encapsulation material. In various embodiments, at least three pressure sensor regions of the plurality of pressure sensor regions may be free from encapsulation.

In various embodiments, at least one pressure sensor region may include a pressure measuring inlet structure configured to receive a fluid supply structure. The fluid supply structure may include a tube, e.g. a flexible tube. The pressure measuring inlet structure may include a holding structure configured to hold the fluid supply structure. The pressure measuring inlet structure may include a sealing structure configured to seal a coupling with the fluid supply structure.

The method may further include providing a chip carrier to carry the chip or the plurality of chips. In various embodiments, the method may further provide bonding or attaching the chip or the plurality of chips to the chip carrier. Bonding or attaching the chip or the plurality of chips to the chip carrier may include surface mounting technology (SMT). Bonding or attaching the chip or the plurality of chips to the chip carrier may include through hole technology (THT). Bonding or attaching the chip or the plurality of chips to the chip carrier may include flip chip bonding. The chip carrier may include a leadframe.

In various embodiments, the method may further include forming at least one electrical contact being partially free from encapsulation material. Forming at least one electrical contact being partially free from encapsulation material may include covering partially the at least one electrical contact prior to depositing the encapsulating material.

In various embodiments, the at least one chip may include at least one chip contact. In various embodiments, at least one chip of the plurality of chips may include at least one chip contact. The at least one chip contact may be electrically coupled with at least one electrical contact. The at least one chip contact may electrically coupled with the at least one electrical contact via a wire. The at least one chip contact may electrically coupled with the at least one electrical contact via the chip carrier. The at least one chip contact may electrically coupled with the at least one electrical contact via a redistribution layer.

In various embodiments, the method may further include forming at least one electronic circuit. In various embodiments, the at least one electronic circuit may be configured to process sensor signals provided by at least one pressure sensor region of the plurality of pressure sensor regions.

In various embodiments, the method may further include forming a redistribution layer coupled to the at least one chip contact. The redistribution layer may be disposed over the encapsulation material. The redistribution layer may be disposed at least partially over the at least one chip. In various embodiments, the method may include covering the redistribution layer at least partially with a dielectric layer. In various embodiments, the method may include embedding the redistribution layer at least partially in a dielectric layer.

In various embodiments, the method may provide depositing dielectric material over the encapsulation material. The method may further provide forming a via on the deposited material and if necessary, on the encapsulation material, to expose the at least one chip contact. The method may also provide depositing a conductive material or a metal such that a redistribution layer is coupled to the at least one chip contact. The method may further provide depositing further dielectric material to form a dielectric layer at least embedding the redistribution layer.

In various embodiments, the method may provide depositing a conductive material or a metal over the encapsulation material. The method may further provide forming a via on the encapsulation material. The method may additionally provide depositing dielectric material to form a dielectric layer at least partially covering the redistribution layer.

In various embodiments, the plurality of chips may be monolithically integrated on the same substrate (e.g. the same wafer).

In various embodiments, encapsulating the chip using encapsulation material includes a film assisted molding process.

In various embodiments, the chip package may include a embedded package. In various embodiments, the method includes a embedded wafer level ball grid array (eWLB) process. The eWLB process may include forming a redistribution layer electrically coupled to at least one chip contact of a chip. The eWLB process may include forming a dielectric layer. The eWLB process may include forming at least one electrical contact coupled to the redistribution layer. The at least one electrical contact may be formed on the dielectric layer. The at least one electrical contact may be formed on the redistribution layer. In various embodiments, dielectric material may be disposed over the chip, including the pressure sensor regions to form a dielectric layer. In various embodiments, the method further includes photostructuring to keep the pressure sensor regions free from dielectric material (i.e., to open up the dielectric layer to expose the pressure sensor regions).

In various embodiments, the method includes a BLADE process. In various embodiments, dielectric material may be disposed over the chip, including the pressure sensor regions to form a dielectric layer. In various embodiments, the method further includes laser drilling to keep the pressure sensor regions free from dielectric material (i.e., to open up the dielectric layer to expose the pressure sensor regions).

FIG. 9 shows a schematic of manufacturing a chip package according to various embodiments. FIG. 9A shows a schematic 900a of a portion of a processed wafer according to various embodiments. The method may include forming more than one chip on a wafer. The method may further include selecting a plurality of chips 902 out of the more than one chip from the wafer. Selecting the plurality of chips 902 out of the more than one chip may include singulating the plurality of chips from the wafer. Singulating the plurality of chips from the wafer may include cutting (or sawing) the plurality of chips from the wafer. In various embodiments, the plurality of chips forms a single integral block (or assemblage). FIG. 9B shows a schematic 900b having a cross sectional side view of a singulated block (or assemblage) including a plurality of chips 902 according to various embodiments. FIG. 9C shows a schematic 900c having a top planar view of the singulated block (or assemblage) in FIG. 9B according to various embodiments. Each chip of the plurality of chips 902 may include at least one pressure sensor region 902. The block of plurality of chips 902 may include at least three pressure sensor regions 904.

Figure 9A:
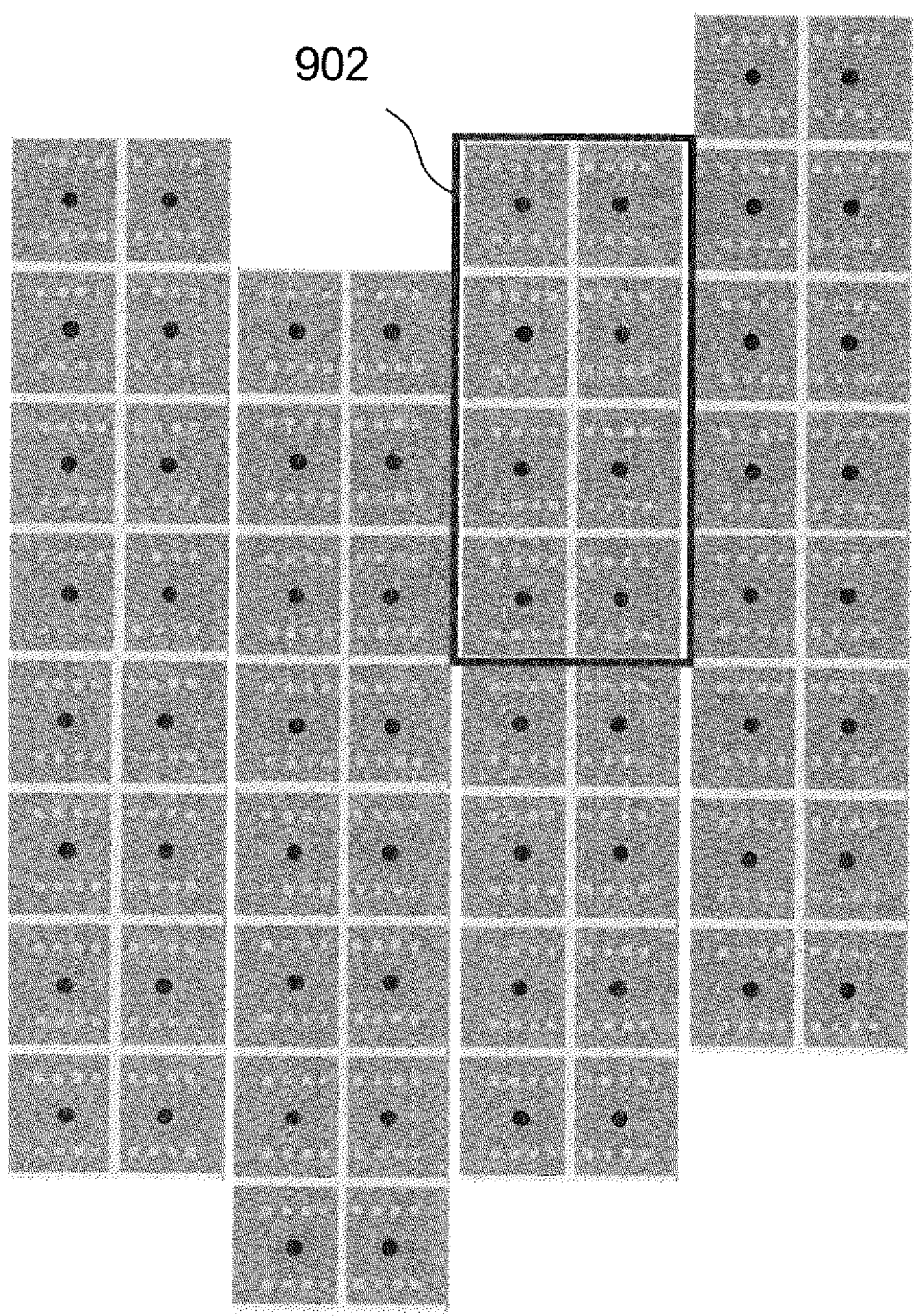
Figure 9B:
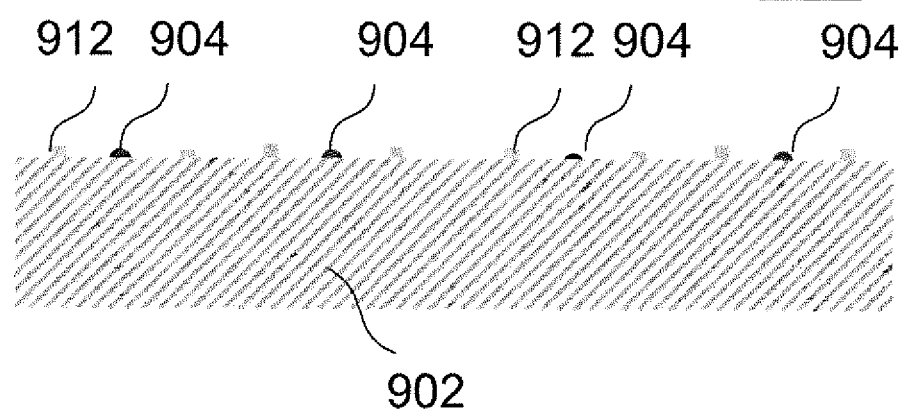
Figure 9C:
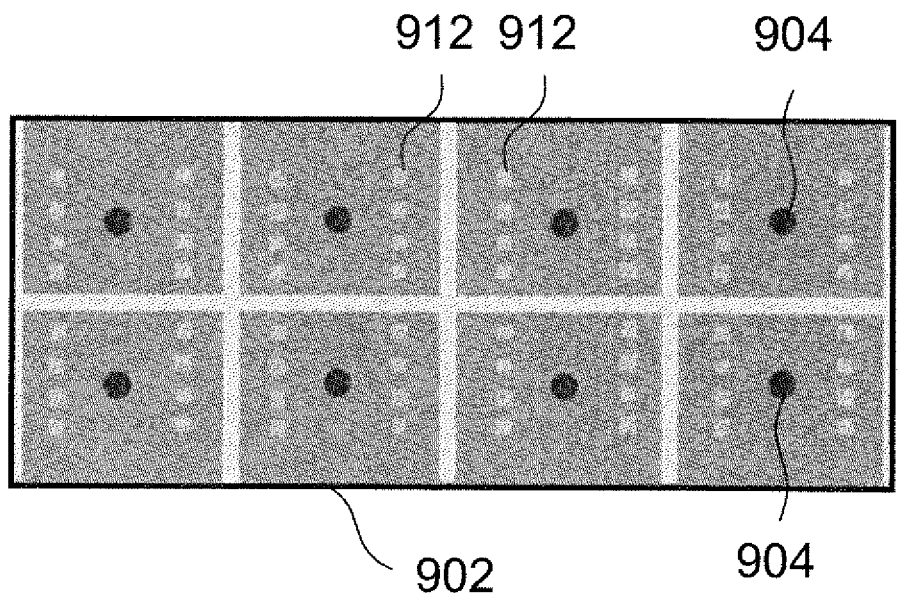
Figure 9D:
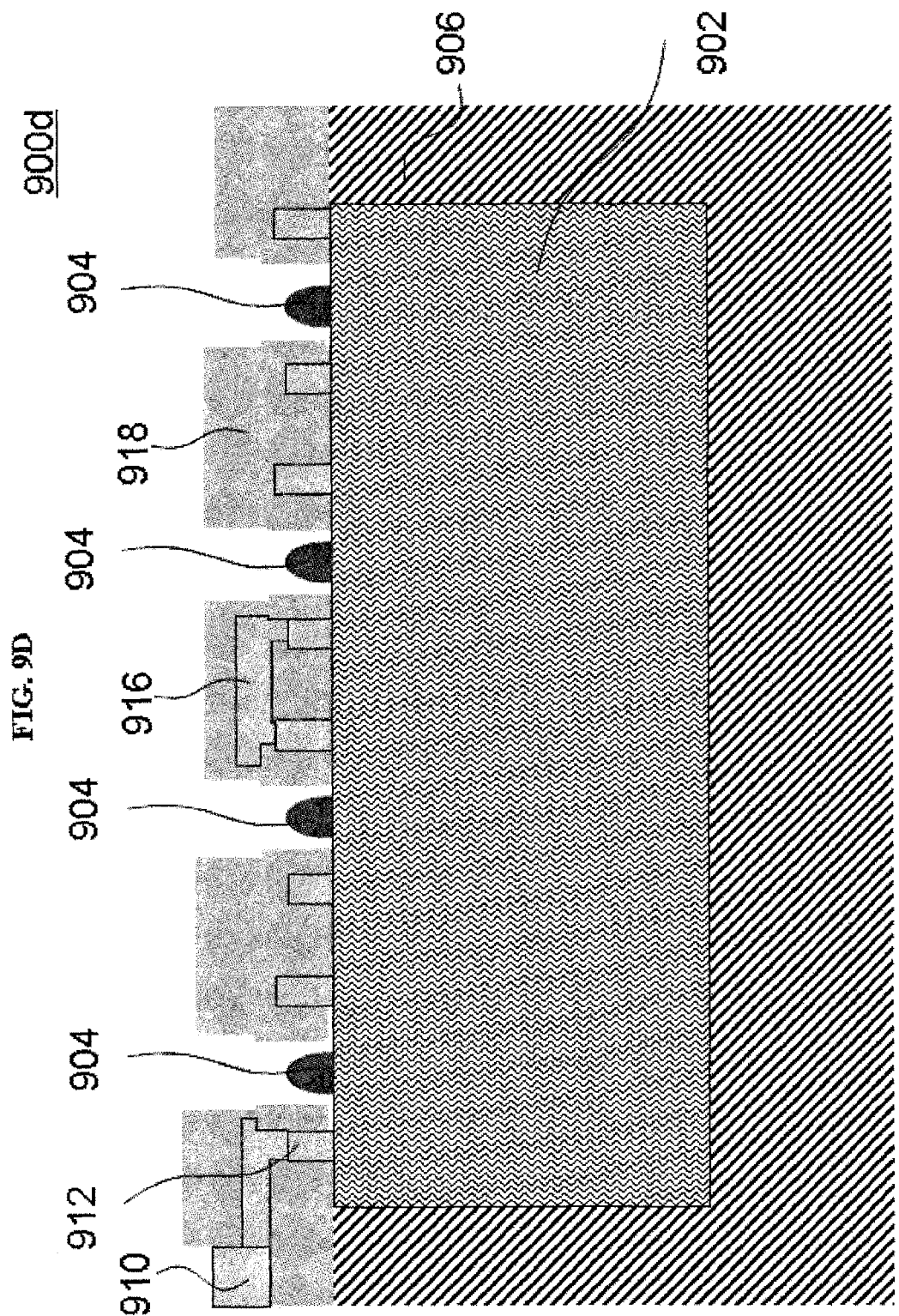
Figure 9E:
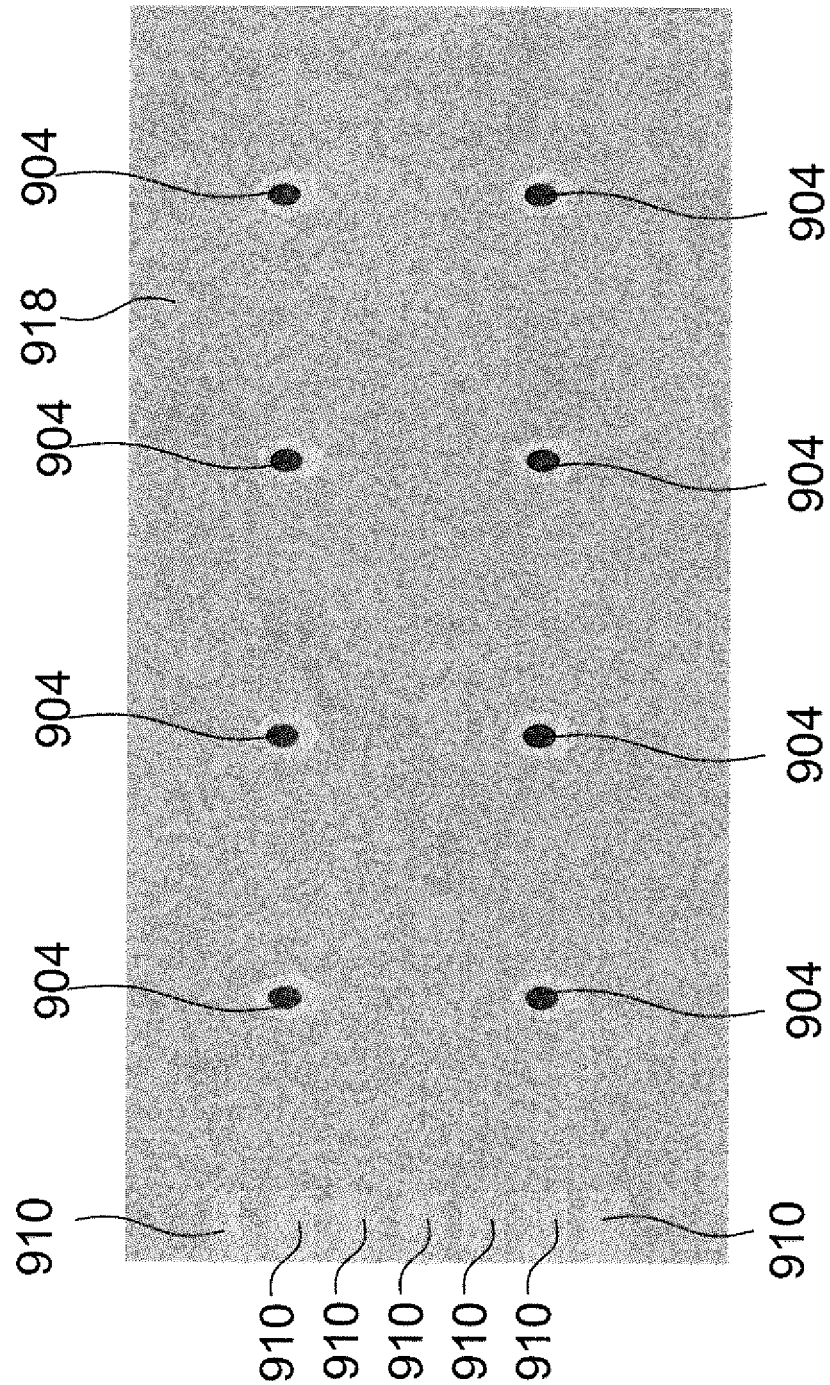

FIG. 9D shows a schematic 900d having a cross sectional side view of a chip package according to various embodiments. FIG. 9D corresponds to the singulated block in FIG. 9B and FIG. 9C after further processing. FIG. 9E shows a schematic 900e having a top planar view of the chip package shown in FIG. 9D according to various embodiments.

Each chip 902 may include at least one pressure sensor region 904. At least three pressure sensor regions 904 may be provided. The chip package may further include encapsulation material 906 encapsulating each chip 902. The chip package may include encapsulation material 906 encapsulating the chip or the plurality of chips 902.

In various embodiments, the chip package may include two or more chips 902. Each chip 902 may include at least one pressure sensor region 904. The chip package may have at least three pressure sensor regions 904 in total. The at least three pressure sensor regions 904 may be distributed amongst the two or more chips 902. The two or more chips 902 may be encapsulated by an encapsulation material 906.

In various embodiments, the chip package may include at least one chip 902 having a plurality of pressure sensor regions 904 and encapsulation material 906 encapsulating the chip 902.

The plurality of chips 902 may be configured to detect or measure pressure of a fluid using capacitance. The plurality of chips 902 may each include a membrane structure. The membrane structure may include at least one membrane, having an electrode. The electrode may form a capacitor with a counter electrode. The at least one membrane may be exposed to the fluid. The fluid may cause the at least one membrane to deflect. The distance between the electrode and the counter electrode may change and cause a capacitance change in the capacitor.

In various embodiments, the plurality of chips 902 may be configured to detect or measure pressure of a fluid using piezoresistance. The plurality of chips 902 may each include a membrane structure. The membrane structure may include at least one membrane having a strain gauge. The at least one membrane may be exposed to the fluid. The fluid may cause the at least one membrane to deflect. The strain gauge may have a resistance that changes due to varying force applied to the strain gauge. The strain gauge may for instance, cause current flowing through the strain gauge to vary as the strain gauge is stretched or compressed as the membrane deflects due to varying pressure. In various embodiments, the plurality of chip 902 may be configured to detect or measure pressure of a fluid using pizeoelectricity or any other suitable effects.

In various embodiments, a surface region of at least three pressure sensor regions of the plurality of pressure sensor regions 904 may be free from encapsulation material 906. In various embodiments, the plurality of pressures sensor regions may include the at least three sensor regions. In various embodiments, a surface region of each of the at least three pressure sensor regions may be free from encapsulation material 906. In various embodiments, at least three sensor regions of the plurality of pressure sensor regions 904 may be free from encapsulation material 906.

In various embodiments, at least one pressure sensor region may include a pressure measuring inlet structure configured to receive a fluid supply structure. The pressure measuring inlet structure may include an opening to the chip. The fluid supply structure may include a tube, e.g. a flexible tube. The pressure measuring inlet structure may include a holding structure configured to hold the fluid supply structure. The pressure measuring inlet structure may include a sealing structure to seal a coupling with the fluid supply structure.

In various embodiments, at least one pressure sensor region may be coupled to an enclosed cavity. In various embodiments, at least one pressure sensor region may be coupled to an enclosed cavity includes the at least one pressure sensor region includes a pressure inlet structure coupled to the enclosed cavity. In various embodiments, at least one pressure sensor region is configured to sense a pressure of a fluid. In various embodiments, the at least one pressure sensor region is configured to sense the pressure of the fluid include a pressure inlet structure configured to receive a fluid supply structure. In various embodiments, the at least one pressure sensor region coupled to an enclosed cavity and the at least one pressure sensor region configured to sense a pressure of a fluid may form a differential sensor.

In various embodiments, at least one pressure sensor region may be coupled to a reference volume (a fixed volume of fluid or vaccum that acts as a reference). The at least one pressure sensor region may include a membrane structure. The membrane structure may include at least one membrane.

A first side of the at least one membrane may be coupled to the reference volume. A second side of the at least one membrane opposite the first side may be configured to sense the pressure of the fluid.

In various embodiments, each of the plurality of chips 902 may be configured to detect or measure up to about 15 bars of pressure, e.g. from about 2 bars to about 13 bars, e.g. from about 5 bars to about 10 bars.

In various embodiments, the chip package may include a chip carrier 908 carrying the chip or the plurality of chips 902. The chip or the plurality of chips 902 may be coupled with the chip carrier 908 using surface mount technology (SMT). The chip or the plurality of chips 902 may be coupled with the chip carrier 908 using through hole technology (THT). The chip or the plurality of chips 902 may be coupled with the chip carrier 908 using flip chip bonding. The chip carrier 908 may include a leadframe. The leadframe may be a pre-structured leadframe or a post-structured leadframe. The chip carrier 908 may include a substrate.

In various embodiments, the chip package may include at least one electrical contact 910 being partially free from encapsulation material 906. The at least one electrical contact 910 may be electrically conductive legs such as metal legs. The at least one electrical contact 910 may be electrically conductive pads such as metal pads. The at least one electrical contact 910 may be electrically conductive pins such as metal pins. In various embodiments, the at least one electrical contact 910 may extend from the chip 902.

In various embodiments, the at least one chip may include at least one chip contact 912. In various embodiments, at least one chip of the plurality of chips may include at least one chip contact 912. The at least one chip contact 912 may be electrically coupled with the at least one electrical contact 910. In various embodiments, the at least one chip contact 912 may be electrically coupled with the at least one electrical contact 910 via a redistribution layer 916. In various embodiments, the at least one chip contact 912 may be electrically coupled with the at least one electrical contact 910 via a wire 914 (e.g. wire bond). In other words, the at least one chip contact 912 may be electrically coupled with the at least one electrical contact 910 via wire bonding. In various embodiments, the at least one chip contact 912 may be electrically coupled with the at least one electrical contact 910 via the chip carrier 908. In various embodiments, the at least one chip contact 912 may be electrically coupled with the at least one electrical contact 910 via a redistribution layer 916.

In various embodiments, the chip package may include at least one electronic circuit. The electronic circuit may be configured to process sensor signals provided by at least one pressure sensor region of the plurality of pressure sensor regions 904. The electronic circuit may be configured to control the chip 902.

In various embodiments, the chip package may include a redistribution layer 916 coupled to the at least one chip contact 912. In various embodiments, the redistribution layer 916 may be disposed over the encapsulation material 906. In various embodiments, the redistribution layer 916 may at least be partially covered by dielectric material 918. In various embodiments, the redistribution layer 916 may at least be partially embedded in dielectric material 918. The dielectric material 918 may include polyimide. In various embodiments, the redistribution layer 918 may include a conductive material. In various embodiments, the redistribution layer 918 may include a metal such as aluminium.

In various embodiments, the plurality of chips 902 are monolithically integrated on the same substrate (e.g. the same wafer). In various embodiments, the plurality of chips are integrated to form a single integral block. In various embodiments, the plurality of chips are formed from a single wafer. In various embodiments, the chip package may use a System-on-Chip (SoC) solution. In various embodiments, the chip package may use a System-in-Package (SIP) solution. Various embodiments provide for one single chip design and wafer layout.

In various embodiments, the chip package may include an embedded chip package. In various embodiments, the embedded chip package may include a redistribution layer 916. In various embodiments, the embedded chip package may allow for easier implementation of the redistribution layer 916. In various embodiments, the embedded chip package may provide a flat interface for easier attachment of the pressure measuring inlet structures.

In various, embodiments, the chip package may further include chips without pressure sensor regions, such as application specific integrated circuit (ASIC) chips, processor chips etc.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
   at least one chip comprising a plurality of pressure sensor regions; and
   encapsulation material encapsulating and forming a seal against the chip;
   wherein at least one pressure sensor region comprises:
      a pressure measuring inlet structure configured to receive a fluid supply structure,
      a sealing structure configured to form a seal between the encapsulation and the fluid supply structure, and
      an enclosed cavity under the sealing structure, wherein the encapsulation material forms at least part of the side walls of the enclosed cavity.

2. The chip package of claim 1,
   wherein a surface region of at least two pressure sensor regions of the plurality of pressure sensor regions is free from encapsulation material.

3. The chip package of claim 1,
   wherein the pressure measuring inlet structure comprises a holding structure configured to hold the fluid supply structure.

4. The chip package of claim 1, further comprising:
   a chip carrier carrying the chip.

5. The chip package of claim 4,
   wherein the chip carrier comprises a leadframe.

6. The chip package of claim 1, further comprising:
   at least one electrical contact being partially free from encapsulation material.

7. The chip package of claim 6,
   wherein the at least one chip comprises at least one chip contact; and
   wherein at least one chip contact is electrically coupled with at least one electrical contact.

8. The chip package of claim 1, further comprising:
   at least one electronic circuit.

9. The chip package of claim 6, further comprising:
   a redistribution layer coupled to the at least one chip contact;

wherein the redistribution layer is disposed over the encapsulation material.

\* \* \* \* \*